United States Patent
Lee et al.

[11] Patent Number: 6,148,431
[45] Date of Patent: Nov. 14, 2000

[54] ADD COMPARE SELECT CIRCUIT AND METHOD IMPLEMENTING A VITERBI ALGORITHM

[75] Inventors: Inkyu Lee, Edison, N.J.; Jeffrey Lee Sonntag, Allentown, Pa.

[73] Assignee: Lucent Technologies Inc., Murray Hill, N.J.

[21] Appl. No.: 09/049,158

[22] Filed: Mar. 26, 1998

[51] Int. Cl.$^7$ .................................................. H03M 13/03
[52] U.S. Cl. .................... 714/794; 375/341; 714/792; 714/797
[58] Field of Search .................. 714/792, 794, 714/797

[56] References Cited

U.S. PATENT DOCUMENTS

| | | | |
|---|---|---|---|
| 4,583,078 | 4/1986 | Shenoy et al. | 341/51 |
| 4,614,933 | 9/1986 | Yamashita et al. | 341/51 |
| 4,802,174 | 1/1989 | Hiraiwa et al. | 714/789 |
| 4,905,317 | 2/1990 | Suzuki et al. | 341/51 |
| 5,027,374 | 6/1991 | Rossman | 375/341 |
| 5,068,859 | 11/1991 | Collins et al. | 714/795 |
| 5,295,142 | 3/1994 | Hatakeyama | 714/794 |
| 5,412,669 | 5/1995 | Foland, Jr. | 714/796 |
| 5,418,795 | 5/1995 | Itakura et al. | 714/796 |
| 5,432,803 | 7/1995 | Liu et al. | 714/794 |
| 5,448,583 | 9/1995 | Miyamoto et al. | 714/795 |
| 5,509,021 | 4/1996 | Todoroki | 714/795 |
| 5,537,424 | 7/1996 | Karabed et al. | 714/795 |
| 5,594,742 | 1/1997 | Hemmati | 714/792 |
| 5,987,490 | 11/1999 | Alidina et al. | 708/523 |
| 5,987,637 | 11/1999 | Thomas | 714/795 |
| 5,991,341 | 11/1999 | Shin | 375/265 |
| 6,058,146 | 5/2000 | Yoshida | 375/341 |

OTHER PUBLICATIONS

Black, P.J.; Meng, T.H.–Y., "A 140 Mb/s 32–state radix–4 Viterbi decoder", Solid–State Circuits Conferences, 1992. Digest of technical papers. 39th ISSCC, 1992 IEEE International, pp. 70–71, 247.

*Primary Examiner*—Albert De Cady
*Assistant Examiner*—Guy Lamarre
*Attorney, Agent, or Firm*—Ian M. Hughes; Steve Mendelsohn

[57] ABSTRACT

A detector system employing a Viterbi algorithm includes an apparatus and method which constructs a double-state trellis structure for determining a most likely received symbol sequence with respect to an observed sequence of channel output samples. In the double state trellis, pairs of states are identified having equivalent branch metric values which also have a same decision during a path select, thus allowing these pairs of states to share a compare operation of a previous state metric. Consequently, to calculate an updated or current state metric value, an add, compare and select (ACS) circuit may compare only the previous state metric values to determine a minimum value for a transition between two states while combining each previous state metric value with its corresponding branch metric to provide an updated or current state metric value.

15 Claims, 5 Drawing Sheets

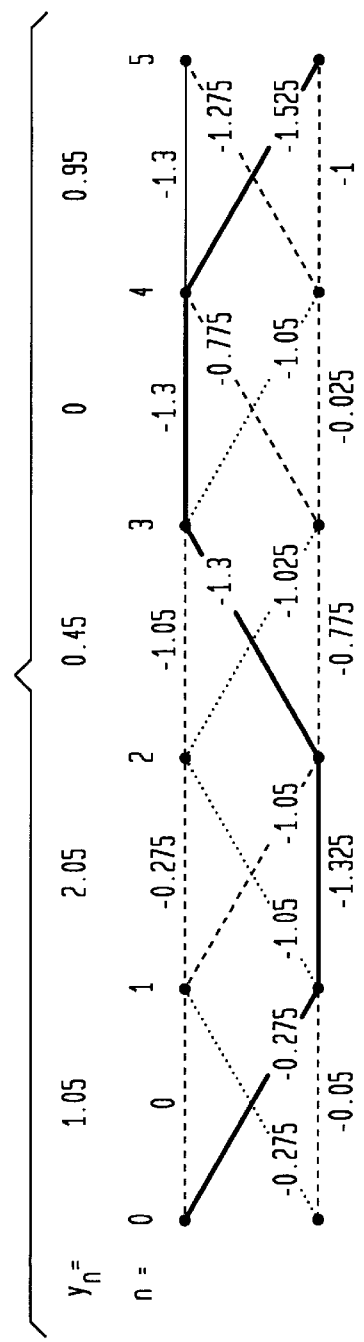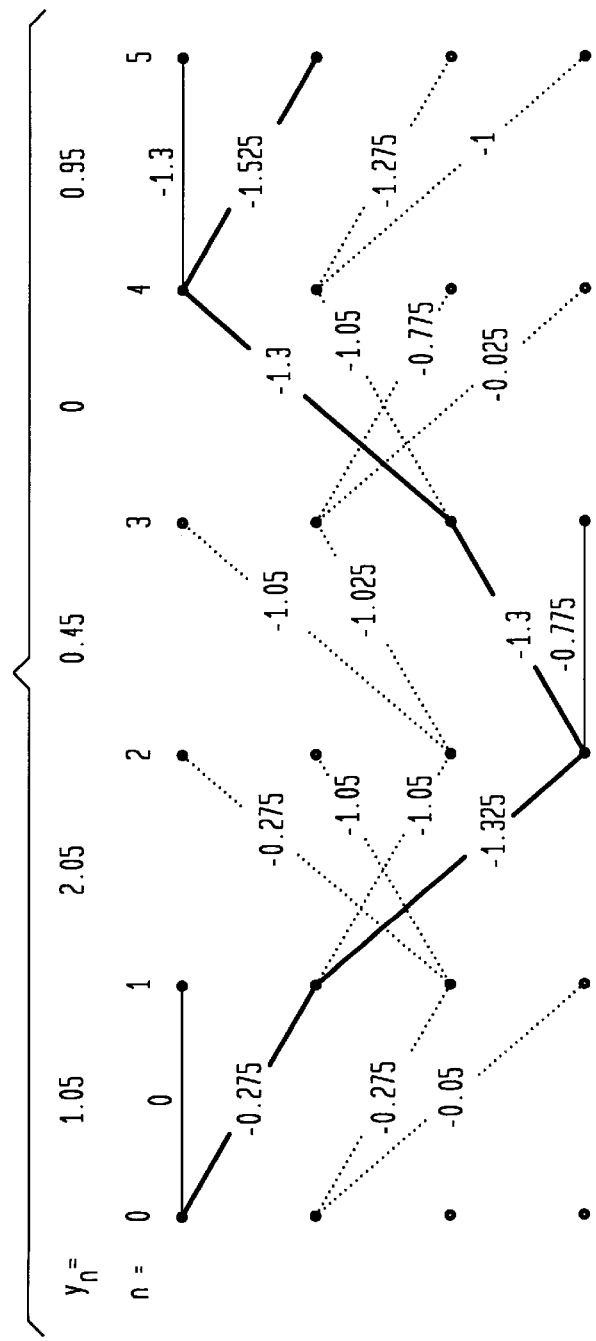

ADD COMPARE SELECT CIRCUIT AND METHOD IMPLEMENTING A VITERBI ALGORITHM

FIELD OF THE INVENTION

The present invention relates in general to circuitry for decoding of symbol sequences, and, more particularly, to improvements to Add-Compare-Select (ACS) circuitry implementing a Viterbi algorithm.

BACKGROUND OF THE INVENTION

Many digital systems commonly employ maximum likelihood sequence detection to enhance detection of signals representing a sequence of symbols transmitted through a form of communication channel in which noise is added to the transmitted digital signal. For example, magnetic recording systems first encode data with error correction and modulation encoding, and then convert the encoded data into symbols which are recorded as a sequence of symbols on a magnetic media. The media may then be read to provide a detected sequence of symbols. A detector then employs the sequence detection algorithm to determine a most likely sequence of symbols corresponding to sequence of channel output samples read from the magnetic media.

The Viterbi algorithm (VA) employed by such systems provides a maximum a posteriori estimate of a state sequence of a finite state, discrete time Markov process observed in noise. Given a received sequence of channel output samples corrupted with additive noise, the VA finds a sequence of symbols in a trellis structure which is closest to the received channel output sample sequence according to a predefined metric. As is known, in a communication channel with additive white gaussian noise (AWGN), the VA may be shown to be the optimal maximum-likelihood (ML) sequence detection (MLSD) algorithm. Euclidian distance may be used as a metric for the trellis structure.

Also, many digital communication systems commonly employ error-control codes, or convolutional codes, to improve the probability of detection error. Telecommunication systems often perform bit interleaving after error correction en coding to minimize transmission errors from bursty noise, and then transmit the convolutionally encoded data as a symbol sequence. For example, the VA may also be used in a channel to decode an error correcting code.

Consequently, systems employing the VA recursively perform three steps, and, for convenience, the transitions between states are usually represented by a trellis structure diagram. First, branch metrics for a trellis are calculated for the current state; second, state metric updates are made for all states, and, third, the survivor paths are determined. The survivor path represents the sequence of symbols entering a given state which are closest, according to the Euclidian distance, to the received sequence of symbols in noise. The branch metric for a state is defined as the Euclidian distance between the received symbols and the ideal channel output sample corresponding to the state. To compute the entire, or global, sequence most likely received, the VA recursively calculates and updates a state metrics of all states.

As is known in the art, for the MLSD algorithm described above, the branch metric of a given transition is defined as the negative logarithm of the likelihood function with respect to the received noisy channel output sample $y_n$, where n=1,2, . . . , and the ideal channel output sample corresponding to the transition. Therefore, the branch metric $BM_{i,k}{}^{n+1}$ for the transition from the ith state at time n to the kth state at time n+1, for the exemplary MLSD algorithm, is given by equation (1):

$$BM_{i,k}{}^{n+1} = -1n\ f(y_n - t_n) \qquad (1)$$

where "i" represents the starting state, "n" represents time n, $t_n$ is the ideal channel output sample corresponding to the transition from the ith state to the kth state and f(*) is the probability density function of the Gaussian noise sequence.

Further, given a received sequence of y represented by a channel response polynomial H(D), where D is a delay operator, the VA recursively optimizes the most-likely path by accumulating the branch metric for each state. The number of states is given as $M^N$, where M represents the size of the input alphabet or input levels and N denotes the channel memory length. For the VA, each state is given a state metric value at time n, and when a new value is received at time n+1, each state metric value is updated. FIG. 1A illustrates the update operation of the state metrics $SM_{i(m)}$ for m=(1,2, . . . M) for the transition between the $i_{(m)}$th and kth states. For each of the state metrics of the trellis structure at time n+1, the previous state metrics at state i(m) ($SM_{i(m)}$) at time n and the corresponding branch metric going from the $i_{(m)}$th to the kth state are added together. Then the state metric for the kth state is updated to be the current $SM_k$ by choosing the minimum of all possible cases as given in equation (2):

$$SM_k^{n+1} = \min_{i(m), m=1\ \text{to}\ M} (SM_{i(m)}^n + BM_{i(m),k}^{n+1}) \qquad (2)$$

where "$i_{(m)}$" represents the starting state, "n" represents time n, and $BM_{i,k}{}^{n+1}$ represents the branch metric at time n+1 associated with the transition from the $i_{(m)}$th to the kth states. For convenience, the "n" and "n+1" notation is assumed by one skilled in the art and is normally dropped.

A circuit which implements this operation is commonly referred to as the Add-Compare-Select circuit (ACS). For a binary input sequence, FIG. 2 shows an ACS circuit of the prior art which calculates the state metric value update $SM_k$ shown in FIG. 1 and given by equation (2), and for the binary case M=2. The ACS circuit 202 typically employs adders 210 and 212, a comparator 214 and a selection circuit 216, which may be a 2 to 1 multiplexer controlled by the output signal of comparator 214.

As shown in FIG. 2, adder 210 receives and combines the state metric $SM_i$ and the corresponding branch metric $BM_{i,k}$ into a first updated state metric, and adder 212 receives and combines the state metric $SM_j$ and the corresponding branch metric $BM_{j,k}$ into a second updated state metric. The first and second updated state metric values of adders 210 and 212 are compared in comparator 214, which provides a minimum indicator signal $D_k$ indicating which one of the first and second updated state metric values is a minimum value. The updated first and second state metric values and the minimum indicator signal $D_k$ are provided to selection circuit 216, which then provides the minimum one of the first and second updated state metric values as the new state metric value $SM_k$ responsive to the minimum indicator signal $D_k$.

Since each update operation is performed serially in the ACS circuit 202 of the prior art, the ACS circuit 202 may control the speed and throughput of a system employing a VA detector. Hence, the ACS may be a bottleneck for increasing the throughput of an entire system's circuitry. Therefore, there is a need for a new state metric update structure which may increase the speed of the ACS circuit of a decoder employing the Viterbi, or similar, algorithm.

SUMMARY OF THE INVENTION

The present invention relates to a circuit and method which performs an Add-Compare-Select (ACS) function of a double state trellis structure to provide a current state metric value of a current state from a set of previous states, each of which has a respective previous state metric value. The circuit and method 1) combines each respective previous state metric value of the set of previous states with a respective branch metric value defined for a transition between the respective one of the set of previous states and the current state, to provide a respective updated state metric value, and each branch metric value is equivalent to one another; 2) compares each previous state metric value of the set of previous states to determine one previous state metric value being a minimum value; 3) provides a select signal corresponding to the one previous state metric value being a minimum value; and 4) selects, responsive to the select signal, as the current state metric value the respective updated state metric value provided from the combination of the one minimum previous state metric value with the respective branch metric value.

BRIEF DESCRIPTION OF THE DRAWINGS

The aforementioned features and benefits of the invention will be better understood from a consideration of the detailed description which follows taken in conjunction with the accompanying drawings, in which:

FIG. 8 illustrates an two state trellis structure of the prior art of a decoder employing the Viterbi algorithm in a binary 1+D channel; and FIG. 9 illustrates a double-state trellis structure as used in accordance with the present invention employing the Viterbi algorithm in a binary $1+D+0*D^2$ channel.

DETAILED DESCRIPTION

Detection System

The present invention relates to ACS circuit and method implementing a Viterbi algorithm which defines a double-state trellis structure for determining a most likely received symbol among a set of all possible sequences. In the double state trellis, pairs of states are identified having equivalent branch metric values which also have a same decision during a path select, thus allowing these pairs of states to share a compare operation of a previous state metric. Consequently, to calculate an updated or current state metric value, the ACS circuit may compare only the previous state metric values to determine a minimum value for a transition between two states, while also combining each previous state metric value with its corresponding branch metric to provide an updated or current state metric value in a parallel operation. Further, since pairs of states having the same decision are identified, both current state updates for state pairs may be performed at the same time.

For the following discussion, aspects of the present invention are presented with reference to an MLSD algorithm employed within a detector receiving a channel output sample sequence as used in, for example, a ML detector of a magnetic recording and playback system. However, as is known, the Viterbi algorithm may be employed in many different applications, such as convolutional decoding systems. Consequently, the present invention is not so limited to the ML detector and decoder as described herein, and may be employed in any application in which the VA is used.

Figure 3:
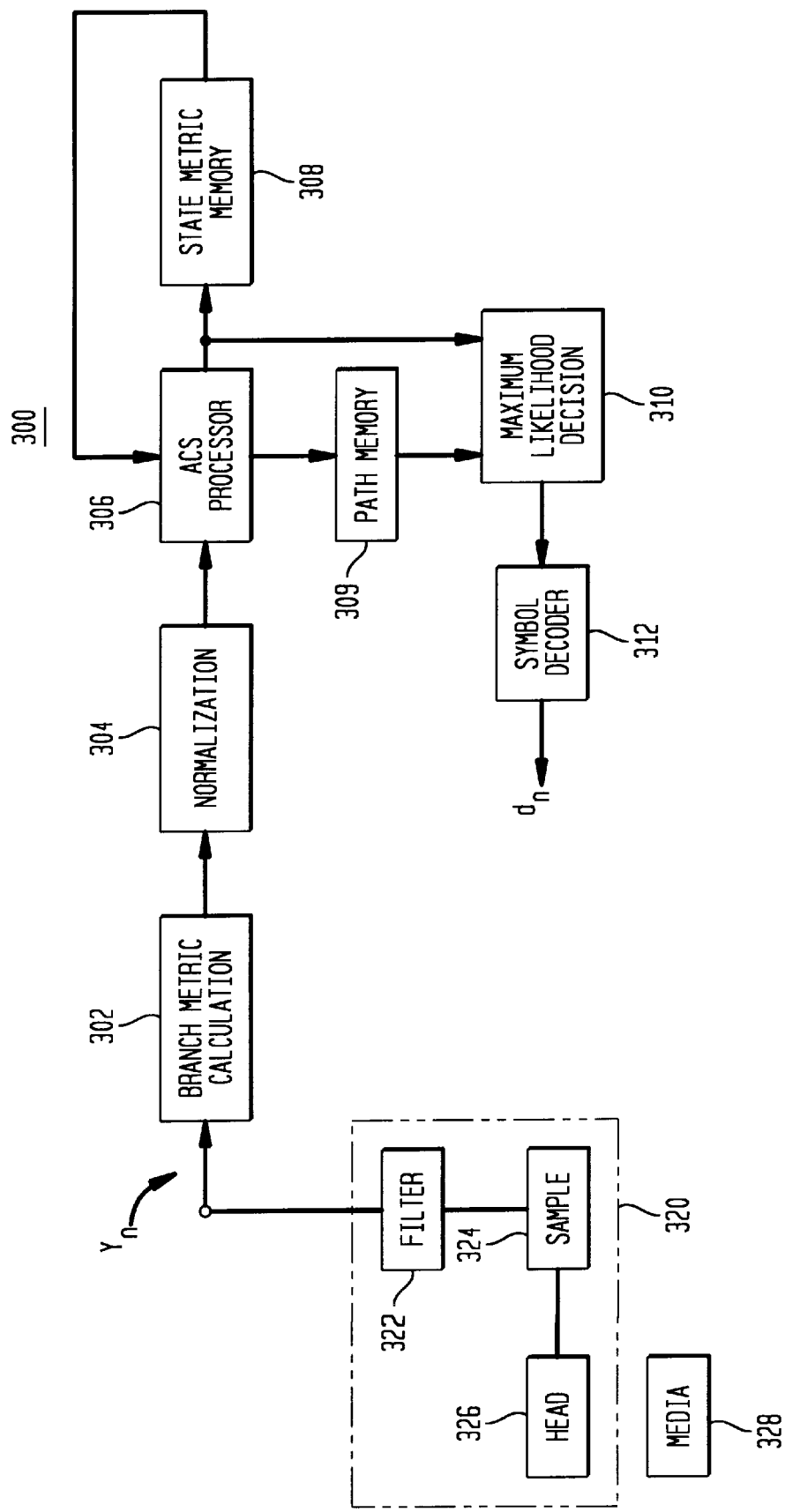
FIG. 3 is a block diagram showing a Viterbi algorithm-based detector employing one exemplary embodiment of the present invention.

FIG. 3 is a block diagram showing a VA-based detector 300 employing one exemplary embodiment of the present invention. As shown in FIG. 3, a detector system 300 under control of a processor, not shown, includes branch metric calculation (BMC) processor 302, optional normalization processor 304, Add-Compare-Select (ACS) processor 306, state metric memory 308, path memory 309, maximum likelihood decision (MLD) processor 310, and optional symbol decoder 312.

BMC processor 302 receives noisy channel output data $y_n$ from a communication channel, and calculates the branch metric for each state using, for example, that calculation given in equation (1). The optional normalization processor 304 receives the branch metric and symbol values $y_n$ and normalizes the received symbol and/or branch metric values according to a predefined algorithm. These normalization algorithms are well known in the art and are based on normalizing according to an estimate of the communication channel response employing ideal channel branch metric values. As is known in the art, the normalization process of optional normalization processor 304 may be included within the BMC processor 302.

An ACS processor 306 in accordance with the present invention calculates the updated current state metric values using previous state metric values. The state metric memory 308 contains the previous and current state metric values processed by the ACS processor 306 for the state metric update calculation. The path memory 309 contains information relating to path segments selected between states.

The maximum likelihood decision MLD processor 310 receives information as to the past and present states, as well as survivor path information. Initially, decision is delayed for a predefined number of iterations from an earlier channel output sample, ten for example. The most likely path of the current state at time n through the trellis structure diagram is determined to make a decision as to the symbol corresponding to the earlier channel output sample of the state at time n−10. Consequently, with the tenth symbol received in the example, a decision is made as to the first symbol. With the next channel output sample transition, or when the eleventh symbol is received, a decision is made as to the second symbol, and so on. As would be apparent to one skilled in the art, many variations as to the symbol decision technique may be made within the spirit of the present invention.

Optional symbol decoder 312 receives the symbols determined from the MLD processor and decodes these symbols to provide a data stream $d_n$. Such symbol decoder 312 may include, for example, run-length and/or error correction decoding of the symbol stream. These forms of encoding and decoding further reduce the possibility of errors in the data stream $d_n$ for correcting bit errors. As would be apparent to one skilled in the art, the present invention is not limited by the form of encoding and decoding used to provide the symbol stream.

The received channel output sample sequence $y_n$ may be provided by, for example, magnetic media reading (MMR) device 320. The MMR device 320 includes a head 326 for receiving encoded data from magnetic media 328, a sampling processor 324 for sampling the analog signal from head 326, and filter 322, which may be a finite impulse response filter (FIR).

Double-State Trellis Architecture

The present invention employs a state metric update derived in accordance with a double-state trellis derived from a single trellis state diagram. For the exemplary embodiment, the input alphabet is assumed to be binary, such that M is 2; as would be apparent to one skilled in the art, the present invention is not so limited and may be extended for any M greater than 2.

The received sequence may also be represented as a channel response polynomial H(D) having a channel length memory of order N, as given in equation (3):

$$H(D) = h_0 + h_1 D + \ldots + h_N D^N \qquad (3)$$

Figure 4:
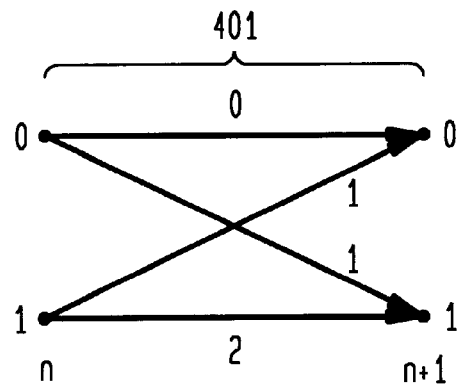
FIG. 4 shows a two state trellis structure diagram of the prior art for a channel response polynomial H(D) equal to 1+D.

FIG. 4 illustrates a two state trellis diagram of the prior art for a channel response polynomial H(D) equal to 1+D as given by equation (3). Given M is 2 for the exemplary embodiment, N is 1. Each number next to the states represents a received input sequence value at time n and time n+1. At time n, the previous states t="0" or "1" transition to a current state "0" or "1" at time n+1. Transition arrows 401 indicate each state transition between time n and n+1. The numbers associated with the transition arrows 401 indicate the ideal channel output sample for the given transition. Given equation (2), the state metric for current state "0" at time n+1 is given as $$SM_0^{n+1} = \min_{t=0,1}(SM_t^n + BM_{t,0}^{n+1}) \qquad (2')$$

Figure 5:
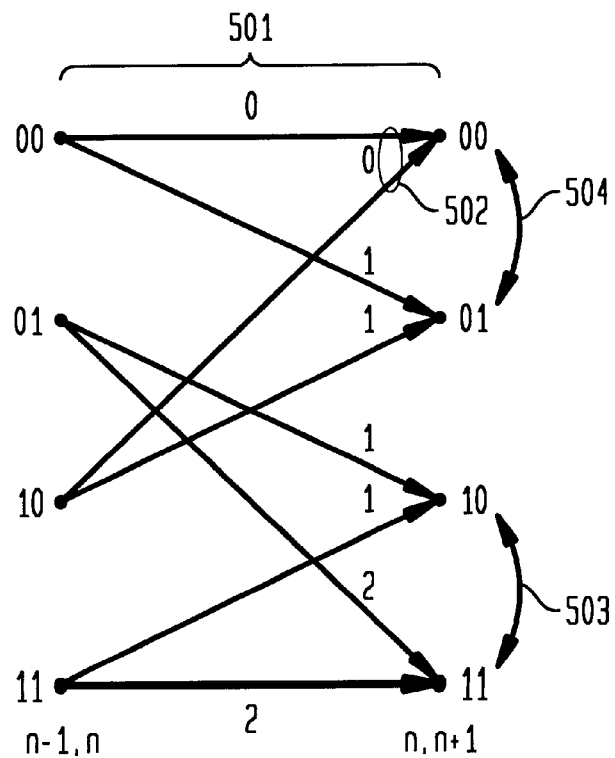
FIG. 5 shows a double-state trellis structure diagram in accordance with an exemplary embodiment of the present invention for a channel response polynomial H(D) equal to $1+D+0*D^2$.

FIG. 5 illustrates a four state trellis structure diagram in accordance with the present invention defined for an assumed channel response polynomial H(D) equal to 1+D+0*D², as given by equation (3). The double-state trellis structure is generally formed by doubling the number of states in the ordinary case by assuming the last term of the channel response polynomial has coefficient $h_N$ of "0." As before, the numbers within the circles next to the states represent the received input sequence values. For example, referring to FIG. 5, the sequence "10" on the left hand side of state trellis represents an input "1" followed by an input "0" at time n−1 and n, respectively. Transition arrows 501 indicate each state transition between time n and n+1. The label values associated with each of transition arrows 501 give the ideal channel output value associated with the transition. For purposes of illustration, previous states "11" and "01" and current states "10" and "11" form state pair 503. Similarly, previous states "00" and "10" and current states "00" and "01" form state pair 504.

For a case of a channel polynomial H(D) which has a zero coefficient for the last coefficient, the branch metrics for two transitions which each have the same ending state are the same, since the two starting states are different in only the oldest bit position. For this case of channel polynomial H(D), the detector of FIG. 3 has $2^{N+1}$ states, even though H(D) is polynomial of order N. Consequently, there is a double state in the trellis diagram since H(D) has $h_N=0$, and this construction makes the branch metrics ending in one state the same. For the double-state trellis diagram of FIG. 5, a detector may compute the state metric in state k ($SM_k$) as the minimum value between two previous state metrics ($SM_i$ and $SM_j$) each combined with the respective branch metric as given by equation (4):

$$SM_k = \min(SM_i + BM_{i,k}, SM_j + BM_{j,k}) \qquad (4)$$

Consequently, choosing a minimum value between two possible state metrics at time n for a transition to state k, which is the minimum between ($SM_i + BM_{i,k}$) and ($SM_j + BM_{j,k}$) as given by equation (4), may be found by computing the minimum value between two previous state metrics $SM_i$ and $SM_j$ and then adding the respective branch metric. For this case, a detector does not require waiting to complete an addition of the branch metric values to the respective previous state metrics ($SM_j$ and $SM_k$) since $BM_{i,k}$ is equivalent to $BM_{j,k}$ (defined as $BM_k$) for any n. Therefore, the detector performs the recursive operation of equation (4) as defined in equation (5):

$$SM_k = \min_{t=i,j}(SM_t + BM_k) \qquad (5)$$

For example, if the current state is "00" on the right hand side of FIG. 5, the two paths 502 from the previous states being "00" and "10", respectively, each have the same branch metric and an ideal channel output sample value of 0. In general for the double state trellis architecture of FIG. 5, for each state "$k_1$", there is a related state "$k_2$" which has the same originating states "i" and "j." The decisions made at these states are the same, since they both compare the same originating state metrics. A similar relationship hold for other current states since for the double state trellis the oldest previous input value at time n−1 does not contribute to a computation of the branch metric for the current state transition for each state. Consequently, $2^N$ decisions exist within the double state trellis architecture, which may require a path memory width of path memory 309 (FIG. 3) of $2^N$.

If the "select" operation of a VA at the current state decides to move to the current state "00" and chooses one path from the previous state "10" rather than the other path from the previous state "00," then the same path decision of the select operation will be made for the current state "01." The same operation is present for the other state pair 503 of current states "10" and "11. " Consequently, pairs of states, for example state pairs 503 and 504, in the double state structure each have the feature of sharing the same decision for the select operation of the ACS. By employing a double state architecture in accordance with the present invention, the "compare" operation of equation (5) may be performed by a circuit at the same time as the "add" operation of equation (5). As would be apparent to one skilled in the art, this characteristic of the double state trellis diagram may be extended to the m-ary case.

Add-Compare-Select (ACS) Circuit

Figure 6:
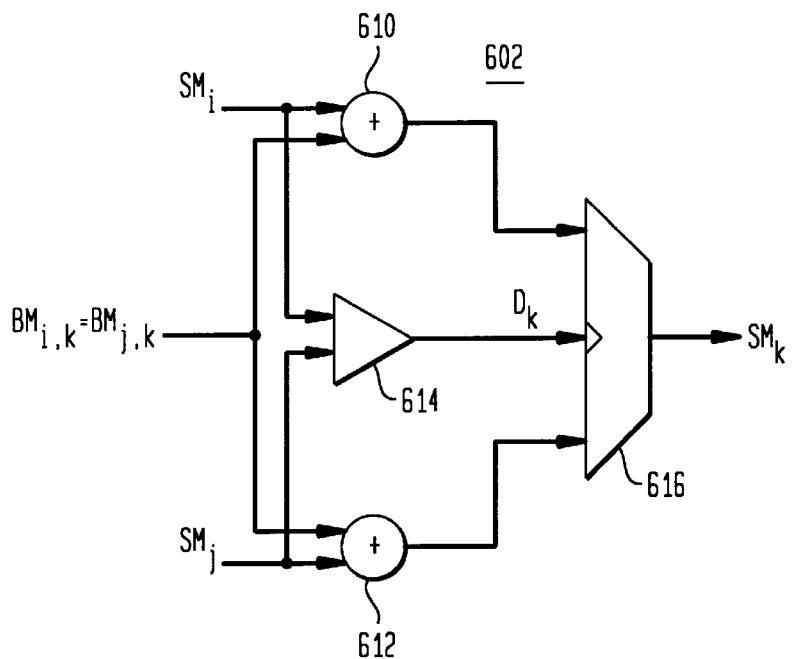
FIG. 6 shows an exemplary Add-Compare-Select circuit in accordance with the present invention.

FIG. 6 shows an exemplary ACS circuit in accordance with the present invention which may implement the operation of equation (5), and this structure is now described. The ACS circuit 602 employs adders 610 and 612, a comparator 614 and a selection circuit 616, which may be a 2 to 1 multiplexer controlled by the output signal of comparator 614. The signal sequence of the exemplary ACS of FIG. 6 is described for the example of FIG. 5, where updated state metric $SM_k$ of state k is calculated.

As shown in FIG. 6, adder 610 receives and combines the state metric of the ith state $SM_i$ with the branch metric $BM_{i,k}=BM_{j,k}$ to provide a first updated state metric, and adder 612 receives and combines the jth state metric $SM_j$ and the corresponding branch metric $BM_{j,k}=BM_{i,k}$ to provide a second updated state metric. The state metric values $SM_i$ and $SM_j$ are compared in comparator 614, which provides a minimum indicator signal $D_k$ indicating which one of the state metric values is a minimum value. The updated first and second updated state metric values and the minimum indicator signal $D_k$ are provided to selection circuit 616, which then provides the minimum one of the first and second updated state metric values as the new state metric value $SM_k$ responsive to the minimum indicator signal $D_k$.

Figure 7:
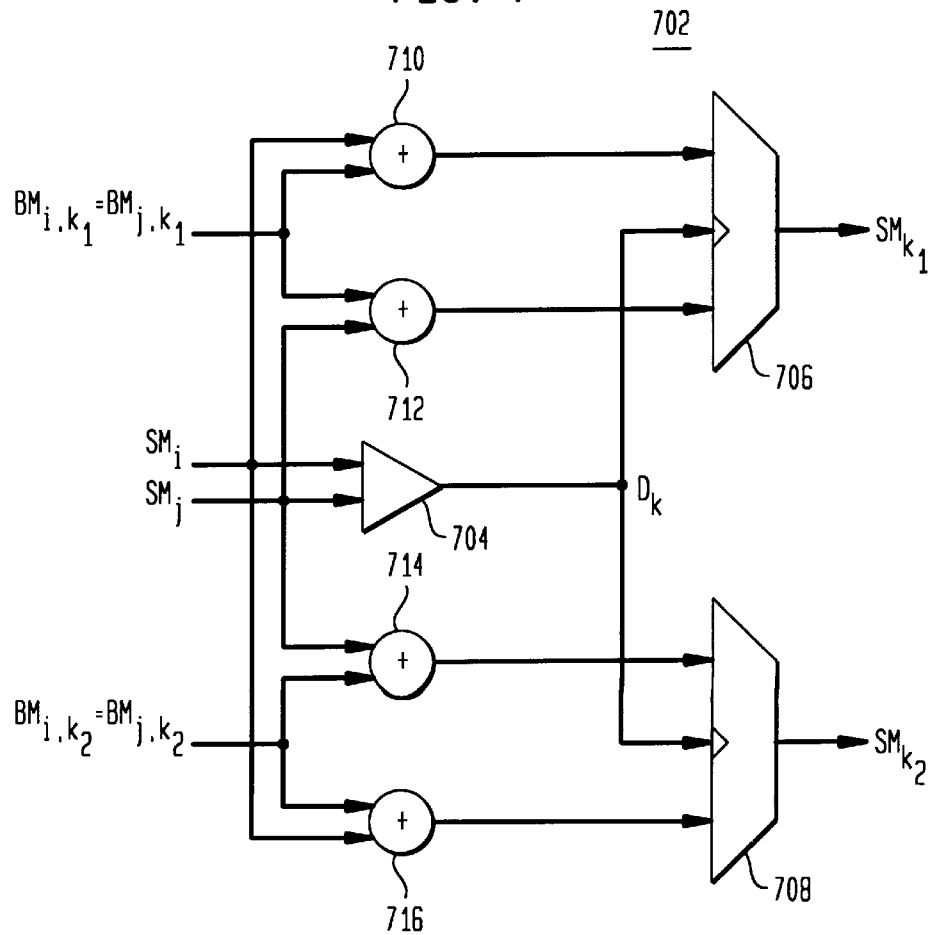
FIG. 7 shows another exemplary Add-Compare-Select circuit in accordance with an alternative embodiment of the present invention.

However, since for each number state "$k_1$", there is a related state "$k_2$" which has the same originating states "i" and "k," the double state trellis architecture of FIG. 5 shows that an alternative ACS circuit may provide a reduction in circuit elements over the ACS circuit shown in FIG. 6 since both the updated state metrics for states "$k_1$" and "$k_2$" may be calculated within the same time period. FIG. 7 shows another exemplary ACS circuit 702 in accordance with an alternative embodiment of the present invention. The ACS circuit 702 employs adders 710, 712, 714 and 716, a comparator 704 and selection circuits 706 and 708, which may be 2 to 1 multiplexers controlled by the output signal of comparator 704. The signal sequence of the exemplary ACS of FIG. 7 is described for the example of FIG. 5, where updated state metrics $SM_{k1}$ and $SM_{k2}$ of states "$k_1$" and "$k_2$" respectively, are calculated concurrently.

As shown in FIG. 7, adders 710 and 712 receive and combine the ith state metric $SM_i$ and jth state metric $SM_j$, respectively, with the branch metrics $BM_{i,k1}=BM_{j,k1}$ to provide a first and a second updated state metric, respectively; and adders 714 and 716 receive and combine the ith state metric $SM_i$ and jth state metric $SM_j$, respectively, with the branch metrics $BM_{i,k2}=BM_{j,k2}$, to provide a third and a fourth updated state metric, respectively. The state metric values $SM_i$ and $SM_j$ are compared in comparator 704, which provides a minimum indicator signal $D_k$ indicating which one of the state metric values $SM_i$ and $SM_j$, is a minimum value. The updated first and second updated state metric values and the minimum indicator signal $D_k$ are provided to selection circuit 706, which then provides the minimum one of the first and second updated state metric values as the new state metric value $SM_{k1}$ responsive to the minimum indicator signal $D_k$. The updated third and fourth updated state metric values and the minimum indicator signal $D_k$ are also provided to selection circuit 708, which then provides the minimum one of the first and second updated state metric values as the new state metric value $SM_{k2}$ responsive to the minimum indicator signal $D_k$.

For the state metric computation of the ordinary trellis structure, as shown, for example in FIG. 4, branch and state metrics need to be computed for every transition within the trellis. However, such is not the case for computation within the double state trellis structure, as shown in FIG. 5. As described, pairs of current states duplicate computation operations, resulting in computation operations for only half of the transitions within the double-state trellis structure.

Figure 1:
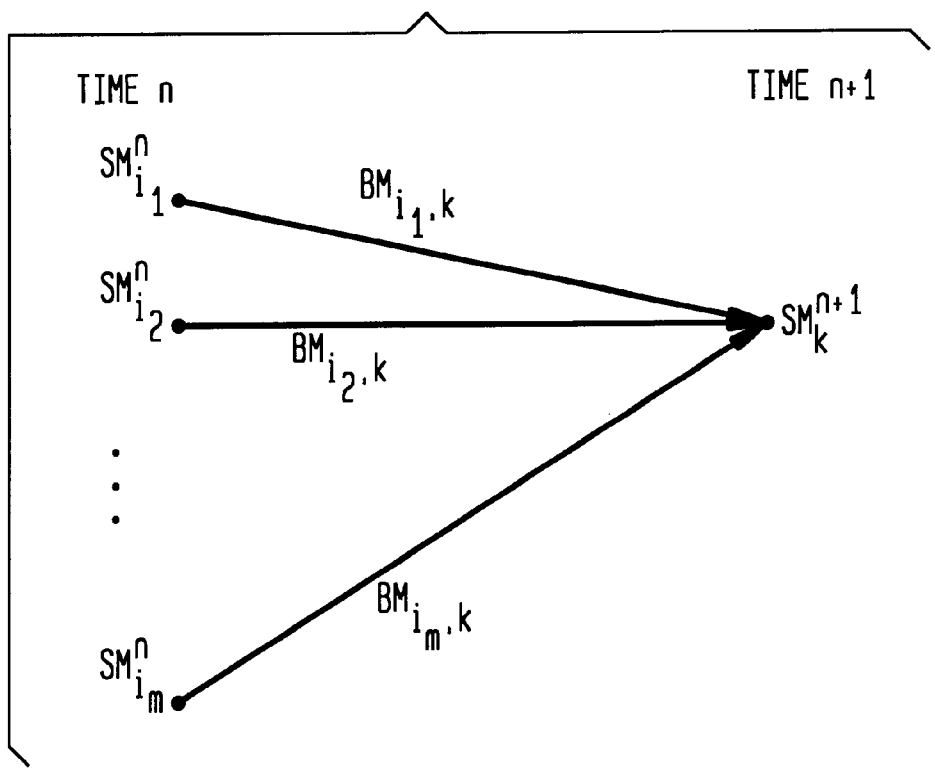
FIG. 1 shows a state metric update operation for a transition between the $i_{(m)}$th and kth states of a Viterbi algorithm.
Figure 2:
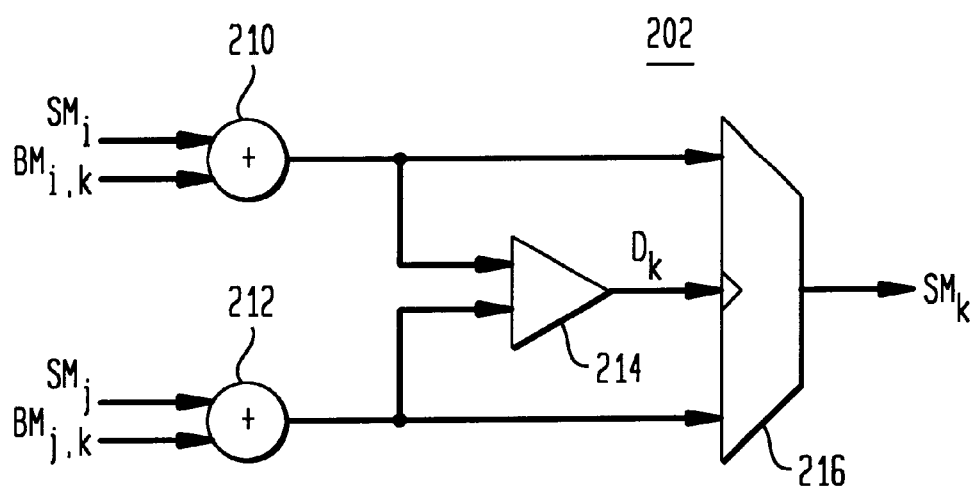
FIG. 2 shows an Add-Compare-Select circuit of the prior art which calculates the state metric update shown in FIG. 1B.

For implementation of a detecting circuit employing an ACS circuit in accordance with the present invention, the double state trellis structure yields double the number of adders, state metric registers and multiplexers compared to the ACS circuit shown in FIG. 2. When implemented on an integrated circuit (IC), these additional circuit elements may increase the IC real estate area of the detector by approximately 50%. However, since the detector typically is only a small part of an IC circuit, the increase in real estate for many telecommunications IC applications may be negligible. However, as would be apparent to one skilled in the art, the detector employing a double-state structure in accordance with the present invention may exhibit faster throughput, yielding a speed which may be approximately 33% faster than the ACS circuit of the prior art shown in FIG. 2.

Ordinary and Double-State ACS Circuit Comparison

FIGS. 8 and 9 together illustrate a comparison of an example of the ordinary and double-state trellis structure for an exemplary channel. FIG. 8 illustrates the ordinary trellis structure of the prior art of a detector employing the Viterbi algorithm in a binary 1+D channel. FIG. 9 illustrates the double-state trellis structure in accordance with the present invention of a detector employing the Viterbi algorithm in a binary $1+D+0*D^2$ channel. Received channel output sample values $y_n$ are given for each time n, n=1,2 . . . , 5. For the exemplary channel of FIGS. 8 and 9, the branch metric values, BM ($\hat{y},y_n$), which are given next to each path segment, are computed using a normalized equation ( 6):

$$BM(\hat{y}, y_n) = -y_n \cdot \frac{\hat{y}}{2} + \frac{\hat{y}^2}{4} \qquad (6)$$

where $\hat{y}$ is the ideal channel output value. In FIGS. 8 and 9, a solid line indicates a survival path, a dotted line indicates a path retained until a symbol decision, and the dashed line indicates a discarded path.

Comparing the survival path segment metric values, the path decision process of FIGS. 8 and 9 may be shown to be identical; however, comparison of the ordinary trellis structure of FIG. 8 with the double state trellis structure of FIG. 9 indicates that a latency is added. For example, at time n=4, the ordinary trellis structure includes a select operation decision which chooses a path with metric −1.3 over the path with metric −0.775, while detectors employing a double-state trellis structure in accordance with the present invention makes the same decision at time n=5. This latency may be corrected for since knowledge of the current sample value is not necessary for a decision. In addition, the double-state trellis structure at the initial stage, n=0, may start with an arbitrary decision, which may also be neglected.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An integrated circuit having an add-compare-select (ACS) circuit, the ACS circuit performing an ACS function to provide a current state metric value of a current state from a set of previous states, each having a respective previous state metric value, the ACS circuit comprising:

a plurality of combining circuits, each of the plurality of combining circuits receiving a corresponding one respective previous state metric value of the set of previous states, and each of which combines the corresponding one respective previous state metric value with a respective branch metric value defined for a transition between the respective one of the set of previous states and the current state, thereby to provide a respective updated state metric value, wherein each branch metric value being equivalent to one another;

a comparator circuit which compares each previous state metric value of the set of previous states to determine one previous state metric value being a minimum value and to provide a corresponding select signal; and a multiplexer which, responsive to the select signal, selects as the current state metric value the respective updated state metric value provided by the one of the plurality of combining circuits which receives the one minimum previous state metric value, wherein the current and previous states are states of a portion of a trellis structure, a sequence of states of the trellis structure corresponding to sequence of received symbols representing data and a number of possible states for each transition determined by the number of possible values for the symbol, and wherein the ACS circuit is configured to implement a double state trellis structure derived from augmentation of the number of possible states of the trellis structure.

2. The ACS circuit as recited in claim 1, wherein the plurality of combining circuits being a first adding circuit and a second adding circuit, the set of previous states includes a first previous state and a second previous state, the first adding circuit combines the respective previous state metric value of the first previous state with the branch metric value, the second adding circuit combines the respective previous state metric value of the second state with the branch metric value, the comparator compares the respective previous state metric values of the first and second previous states to detect the one minimum previous state value, and the multiplexer selects the one updated previous state metric provided by the corresponding one of the first and the second adding circuits which receives the respective previous state value which is the determined minimum one.

3. The ACS circuit as recited in claim 1, wherein the current state is one of a first current state and a second current state and the ACS circuit provides the respective state metric values of the first and second current states, wherein:

the plurality of combining circuits further includes a first set of combining circuits and a second set of combining circuits, each of the first set of combining circuits combining the respective previous state metric value with a respective first branch metric value to provide a respective first updated state metric value, each first branch metric value defined between the respective previous state and the first current state and each being equivalent to one another, and each of the second set of combining circuits combining a respective previous state metric value with a respective second branch metric value to provide a respective second updated state metric value, each second branch metric value being defined between the respective previous state and the second current state and each equivalent to one another; and the multiplexer which, responsive to the select signal, selects as the first and the second current state metric, respectively, one first updated state metric value and one second updated state metric value provided by the respective corresponding ones of the plurality of combining circuits which receive the one minimum previous state metric value.

4. The ACS circuit as recited in claim 3, wherein:

the first set of combining circuits is a first adding circuit receiving a first previous state metric value and a second adding circuit receiving a second previous state metric value, the second set of combining circuits is a third adding circuit receiving the second previous state metric value and a fourth adding circuit receiving the first previous state metric value, the first adding circuit and the second adding circuit each combine the respective one of the first and second previous state metric values with the branch metric value respectively associated with the transition from the first and second previous states to the first current state, and the third adding circuit and the fourth adding circuit each combine the respective one of the first and second previous state metric values with the branch metric value respectively associated with the transition from the first and second previous states to the second current state;

the comparator circuit compares the first previous state metric value with the second previous state metric value; and the multiplexer comprises a first and a second multiplexer, the first multiplexer receiving the respective first updated state metric value of the first and second adding circuits, the second multiplexer receiving the respective second updated state metric value of the third and fourth adding circuits, wherein the first multiplexer selects as the first current state metric value the first updated state metric value corresponding to one of the first and second adding circuits receiving the minimum one previous state metric value, and the second multiplexer selects as the second current state metric value the second updated state metric value corresponding to one of the third and the fourth adding circuits receiving the minimum one previous state metric value.

5. The ACS circuit as recited in claim 1, wherein the ACS circuit is included in a sequence detection circuit which receives a channel output sample, each channel output sample being derived from a symbol, and successive pairs of the sequence of channel output samples characterized by successive pairs of sets of previous and current states, the sequence detection circuit further comprising:

branch metric calculation means for calculating the branch metric value for each transition from each respective previous state to the current state based on one received channel output sample of a portion of the channel output sample sequence received within a predefined period, the one received channel output sample corresponding to the current state;

a state metric memory which stores each respective previous state metric value of each previous state of the successive sets of previous states;

a path memory which stores a plurality of path selections, each path selection being recursively determined between successive pairs of sets of previous states and current states corresponding to the select signal; and detection means for detecting a data symbol value corresponding to an earlier channel output sample of the portion of the channel output sample sequence received before the one received channel output sample, the detecting means detecting the data symbol value based on a sequence of the plurality of path selections ending in the path selection determined for the one received channel output sample corresponding to the current state.

6. The ACS circuit as recited in claim 5, wherein the sequence detection circuit is included in a magnetic media readback device which receives modulation encoded data from a magnetic recording channel and demodulates the modulation encoded data to provide the received channel output sample sequence.

7. The ACS circuit as recited in claim 5, wherein the ACS circuit is included in a decoder of a telecommunications receiver which receives from a telecommunications channel modulated encoded data, the telecommunications receiver demodulating the modulated encoded data to provide the encoded data as the received channel output sample sequence, the encoded data being convolutional coded as the symbol sequence and the ACS circuit decoding the convolutional coded encoded data.

8. The ACS circuit as recited in claim 1, wherein the double state trellis structure is related to a state trellis structure, the state trellis structure including the current state and being derived from a set of states having a corresponding number of state transitions, and the double state trellis structure is related to the state trellis structure in that the double state trellis structure has the number of state transitions with respect to the current state equivalent to the corresponding number of state transitions for each state of the set of states of the state trellis structure.

9. The ACS circuit as recited in claim 8, wherein the received channel output sample sequence of the double state trellis structure is represented by a channel response polynomial having a channel length memory N and defined as $H(D)=h_0+h_1D + \ldots +h_{N-1}D^{N-1}+h_ND^N$, where $h_N$ is 0.

10. The ACS circuit as recited in claim 9, wherein the double state trellis structure is implemented in which each symbol represents a binary value, and a number of the set of states in the state trellis structure having a channel response polynomial defined as $H(D)=h_0+h_1D+ \ldots h_{N-1}D^{N-1}$ being increased to form the double state trellis structure having the channel response polynomial defined as $H(D)=h_0+ h_1D+ \ldots +h_{N-1}D^{N-1}+0D^N$.

11. A maximum likelihood sequence detector including a branch metric calculator, the branch metric calculator calculating a respective branch metric value ($BM_k$) for each transition from each of a set of previous states to a current state k, k being an integer, based on a received channel output sample of a channel output sample sequence, and each of the set of previous states having a respective previous state metric value ($SM_t$), t an integer, the detector including:

a circuit which performs an add-compare-select (ACS) function to provide a current state metric value ($SM_k$) of the current state k, the circuit implementing a double state trellis structure for the set of previous states, the double state trellis structure defined such that for at least one set of M previous states, M an integer, of the set of previous states which transition to the current state k, each of the respective transitions to the current state k having a respective branch metric value $BM_k$ being equivalent to one another, the circuit comprising a processor which calculates:

$$SM_k = \min_{t=1 \text{ to } M} (SM_t) + BM_k.$$

12. The maximum likelihood sequence detector as recited in claim 11, wherein the double state trellis structure being defined for a binary case such that M=2 and being defined such that the current state k is one of X current states, a first pair of the X current states each of the first pair having respective branch metric values from the one set of M previous states being equivalent to one another, a second pair of the X current states each having respective branch metric values from another set of M previous states not including the one set of M previous states, and the respective branch metric values of the second pair being equivalent to one another.

13. The maximum likelihood sequence detector as recited in claim 12, wherein the processor calculates each respective current state metric value of the X current states for at least the first and second pairs of the X current states in parallel.

14. A method of performing an Add-Compare-Select (ACS) function to provide a current state metric value of a current state from a set of previous states, each having a respective previous state metric value, the method comprising the steps of:

a) combining each respective previous state metric value of the set of previous states with a respective branch metric value defined for a transition between the respective one of the set of previous states and the current state, thereby to provide a respective updated state metric value, wherein each branch metric value being equivalent to one another;

b) comparing each previous state metric value of the set of previous states to determine one previous state metric value being a minimum value;

c) providing a select signal corresponding to the one previous state metric value being a minimum value; and d) selecting, responsive to the select signal, as the current state metric value the respective updated state metric value provided from the combination of the one minimum previous state metric value with the respective branch metric value, wherein the current and previous states are states of a portion of a trellis structure, a sequence of states of the trellis structure corresponding to sequence of received symbols representing data and a number of possible states for each transition determined by the number of possible values for the symbol, and wherein the ACS function implements a double state trellis structure derived from augmentation of the number of possible states of the trellis structure.

15. A method of performing an Add-Compare-Select (ACS) finction to provide a current state metric value of a current state k, k an integer, from a set of previous states, each of the set of previous states having a respective previous state metric value ($SM_t$), t an integer, the method comprising the steps of a) calculating a respective branch metric value ($BM_k$) for each transition from each of the set of previous states to the current state k based on a received channel output sample of a channel output sample sequence;

b) implementing a double state trellis structure for the set of previous states, the double state trellis structure defined such that for a set of M previous states, M an integer, of the set of previous states which transition to the current state k, each of the respective transitions to the current state k having a respective branch metric value $BM_k$ being equivalent to one another; and c) calculating the current state metric value ($SM_k$) as:

$$SM_k = \min_{t=1 \text{ to } M} (SM_t) + BM_k.$$

* * * * *